(12) United States Patent
Rinehart et al.

(10) Patent No.: US 6,359,331 B1
(45) Date of Patent: *Mar. 19, 2002

(54) HIGH POWER SWITCHING MODULE

(75) Inventors: Lawrence Edward Rinehart, Milpitas, CA (US); Venkateswara Anand Sankaran, Dearborn; John Michael Miller, Saline, both of MI (US)

(73) Assignees: Ford Global Technologies, Inc., Dearborn, MI (US); Semipower Systems Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/997,220

(22) Filed: Dec. 23, 1997

(51) Int. Cl.[7] .......................... H01L 23/52; H01L 23/48; H01L 23/34
(52) U.S. Cl. .................. 257/691; 257/692; 257/693; 257/696; 257/728
(58) Field of Search ................ 257/692, 691, 257/693, 696, 728, 700

(56) References Cited

U.S. PATENT DOCUMENTS

| | | | |
|---|---|---|---|
| 3,349,481 A | 10/1967 | Karp | |
| 3,374,400 A | 3/1968 | Tabuchi et al. | |
| 4,249,196 A | 2/1981 | Durney et al. | |
| 5,103,283 A | 4/1992 | Hite | |
| 5,177,670 A | 1/1993 | Shinohara et al. | |
| 5,200,364 A | 4/1993 | Loh | |
| 5,528,073 A | * 6/1996 | Gilmore | 257/691 |

* cited by examiner

Primary Examiner—Steven Loke
(74) Attorney, Agent, or Firm—Jennifer M. Stec

(57) ABSTRACT

A power switching module includes a substrate having at least one silicon die forming at least one power switching element and having leadframe terminal posts extending away therefrom. A planar negative rail layer providing a negative power supply and including a non-inductive current shunt resistor formed therein and a planar positive rail layer providing a positive power supply are positioned at the substrate so that the negative rail layer and the positive rail layer are coplanar with respect to each other. A phase output layer providing a phase output signal is also positioned at the substrate. Each of the layers are electrically isolated from each of the other layers and are electrically connected to the substrate.

8 Claims, 8 Drawing Sheets

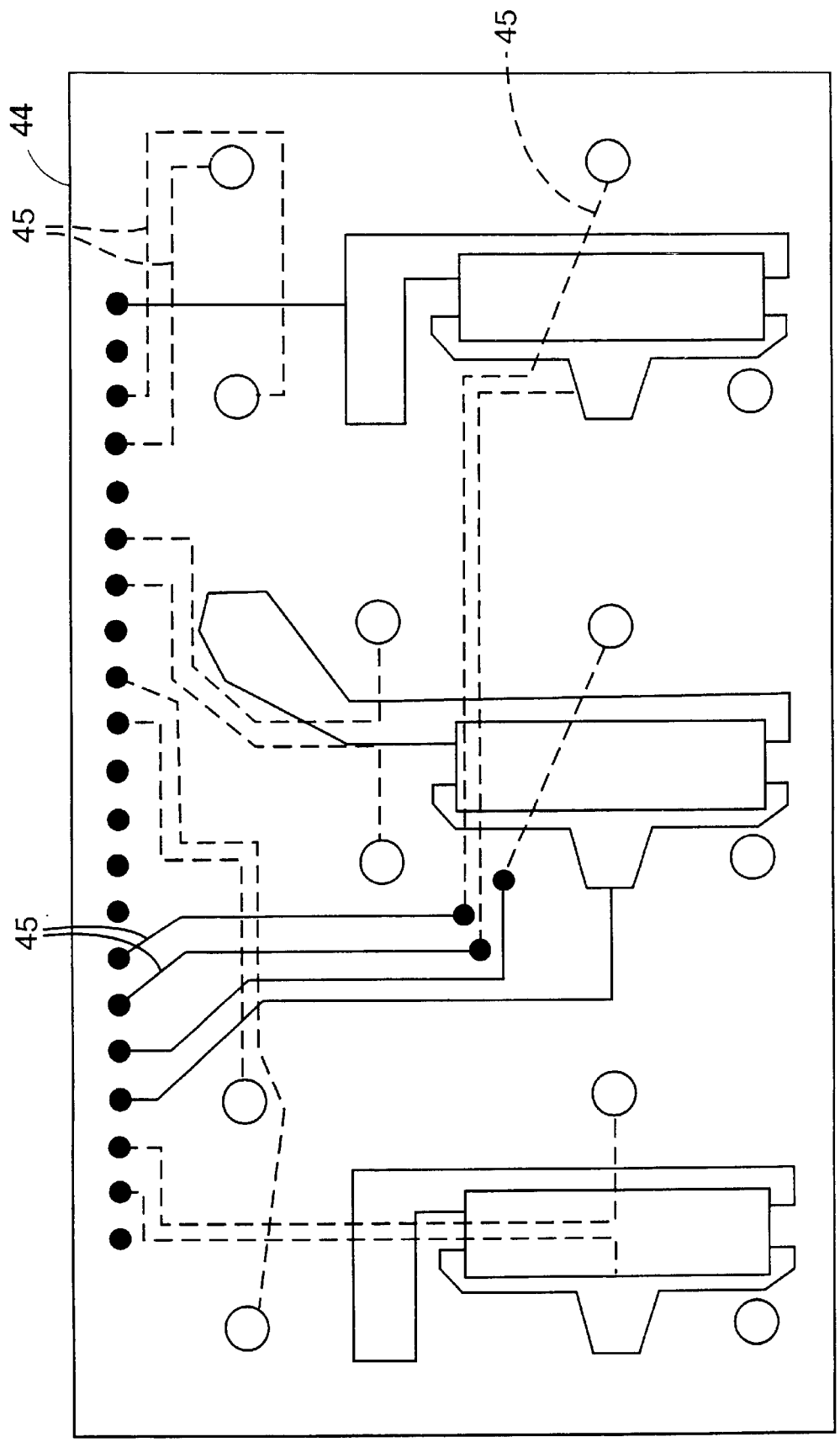

HIGH POWER SWITCHING MODULE

TECHNICAL FIELD

This invention relates to high power switching modules and methods of making same.

BACKGROUND ART

A power switching module may consist of one switch having one or more silicon dies or two switches configured in a half bridge configuration, four switches configured in an H-bridge configuration, or six switches in a three phase bridge configuration, etc. The switches in the module have to be interconnected based on the circuit topology. The interconnections must be carefully designed and laid out to insure that the stray inductance in the bus is kept to a minimum in order to reduce the peak overshoots during turn-off of the switch and during the commutation of the antiparallel diode.

The design approach normally used to reduce the stray inductance is to keep the lead and trace lengths short and to layout the current flow path such that they help in cancelling the fields. Furthermore, the design approach typically involves a single tier design in which the silicon die, device interconnects, and power circuit input and output interconnects are all on the same level on the substrate, as shown in FIG. 1. This approach works well in a single switch module. It is also possible to extend this approach to a half bridge module and to some extent minimize the stray inductance. However, in a three phase module this approach results in significant stray inductance.

Thus, there exists a need for a circuit layout design for interconnecting the circuit terminations in a power switching module that minimizes stray inductance for various possible switch configurations and is easy to manufacture.

DISCLOSURE OF THE INVENTION

It is thus a general object of the present invention to provide an interconnection scheme for circuit terminations in high power switching modules that minimizes stray inductance.

In carrying out the above object and other objects, features, and advantages of the present invention, a unique power switching module is provided. The module includes a negative rail layer for providing a negative power supply to the power switching module and a positive rail layer for providing a positive power supply to the power switching module wherein the negative and positive rail layers are co-planar with respect to each other. The module also includes a phase output layer for providing a phase output signal from the power switching module. Each of the layers are electrically insulated from each of the other layers. The module further includes a substrate having at least one silicon die forming at least one switching element and corresponding leadframe terminal posts extending away therefrom. Each of the layers are connected to certain terminal posts to provide electrical connection between the substrate and each of the layers.

In further carrying out the above object and other objects, features, and advantages of the present invention, a method is also provided for making the above described power switching module. The method includes the step of providing a substrate having at least one silicon die forming at least one switching element and having corresponding leadframe terminal posts extending therefrom. The method also includes the steps of positioning a negative rail layer providing a negative power supply to the power switching module and a positive rail layer providing a positive power supply to the power switching module on the substrate wherein the negative and positive rail layers are co-planar with respect to each other. The method further includes the step of positioning a phase output layer providing a phase output signal onto the substrate and negative and positive rail layers, wherein each of the layers are connected to certain terminal posts to provide electrical connection between the substrate and each of the layers.

The above object and other objects, features and advantages of the present invention are readily apparent from the following detailed description of the best mode for carrying out the invention when taken in connection with the accompanying drawings.

BRIEF DESCRIPTION OF THE DRAWINGS

FIGS. 5a–5f are schematics of the layered interconnect assembly of the present invention in their unbent state.

BEST MODES FOR CARRYING OUT THE INVENTION

Figure 1:
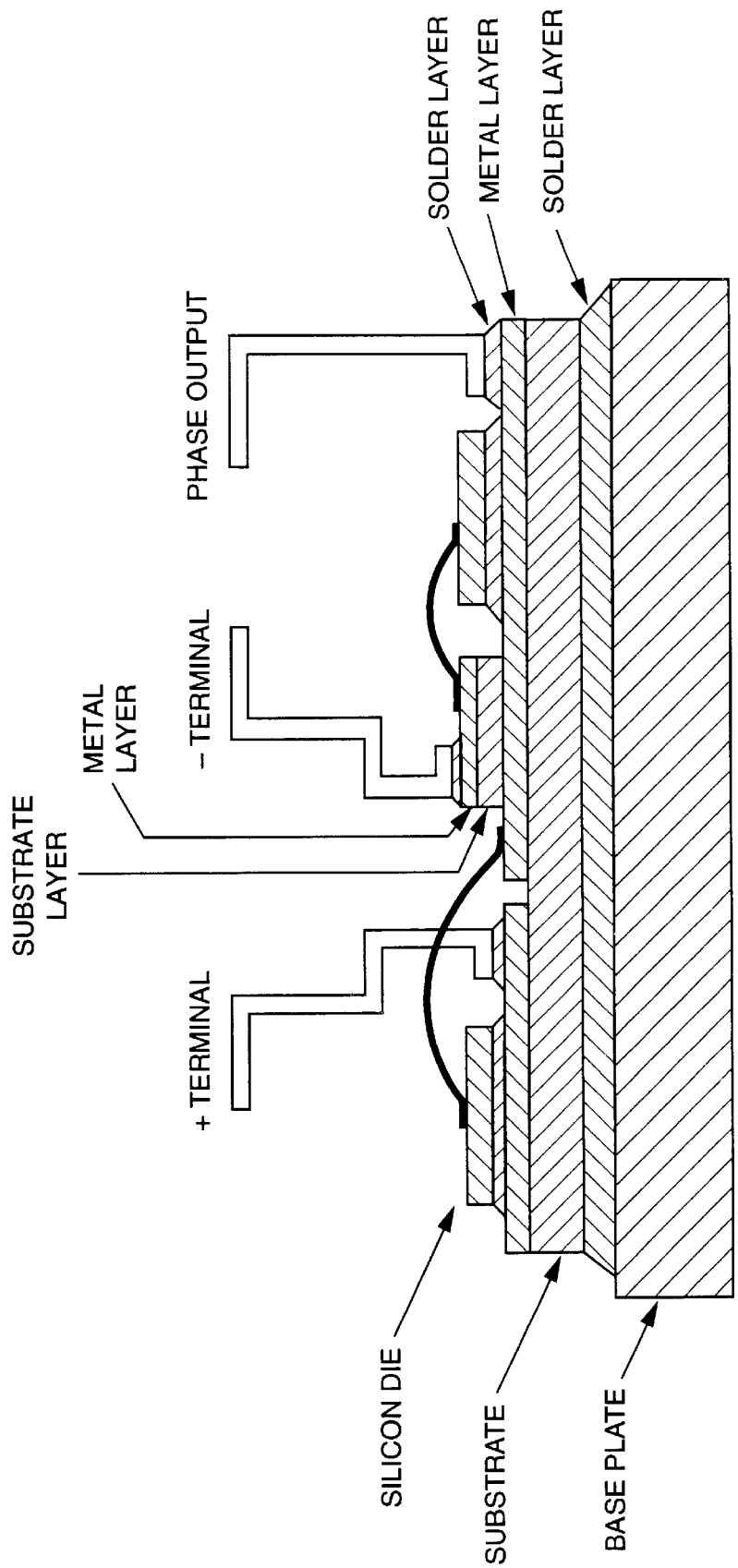
FIG. 1 is a cross-sectional view of a prior art power switching module.
Figure 2:
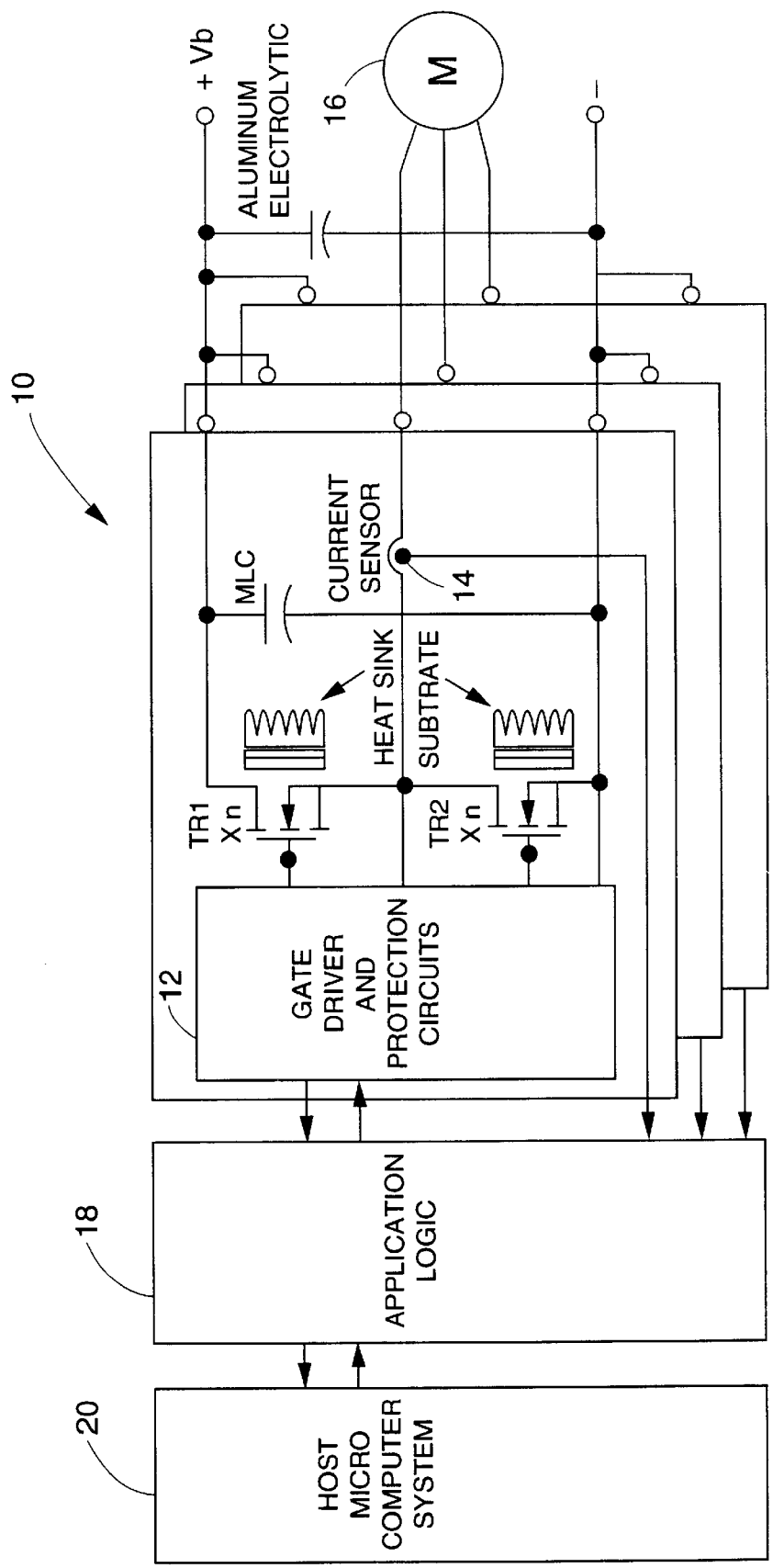
FIG. 2 is a schematic diagram of a power switching module of the present invention.

Turning now to FIG. 2, there is shown a schematic diagram of a typical three phase power switching module, denoted generally by reference numeral 10. The circuit for one phase is shown in FIG. 2, however, two additional circuits similar to the one shown in FIG. 2 are included in the power switching module. The module 10 includes power switching devices TR1 and TR2, gate driver and protection circuits 12, capacitors MLC and sensors 14.

The power switching module 10 drives a load 16, such as a motor, according to application logic 18 and microcontroller 20.

Figure 3:
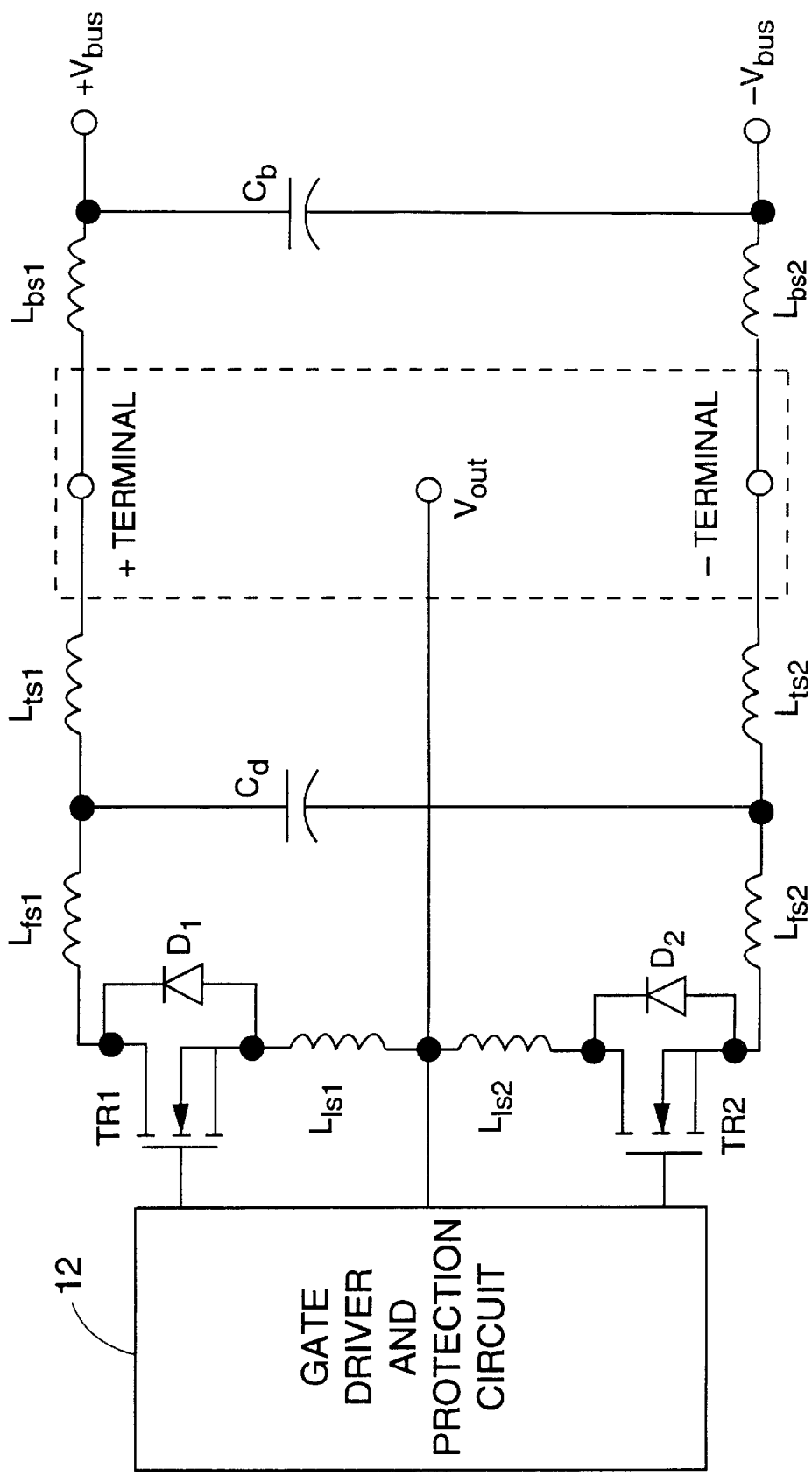
FIG. 3 is a schematic diagram of one phase leg of a half bridge power switching device.

A schematic diagram of an inverter phase of the power switching module 10 is shown in FIG. 3. When switch TR1 is turned on, the current flows through the switch TR1 and when it is turned off the rate of change of current (di/dt) leads to a significant voltage drop across the inductors and this appears across switch TR1. During turn-on and turn-off relatively large voltages and currents exist simultaneously for a portion of the switching transient. This will lead to significant instantaneous power loss in the device, which if repeated at a high enough frequency can result in significant switching losses. Also the switch has to be rated such that the voltage transient is within the safe operating area (SOA) of the devices, TR1, D1, TR2, and D2. This may require that the module 10 be derated significantly, i.e. the module 10 may be rated at a lower voltage than the switch TR1.

As soon as switch TR1 is turned off, the diode D2 begins to freewheel. When switch TR1 is turned on again, the diode D2 will begin to recover and the di/dt during recovery again leads to peak voltage overshoots across switch TR2. The overshoot level can be reduced by slowing down the device, however, this leads to increased switching losses. The other means commonly employed are to use snubbers and clamps to protect the device.

The inductors shown in the circuit are the different stray inductors present due to the physical layout. It is not possible to completely eliminate the stray inductance, however, they can be significantly minimized through proper layout and interconnect design.

The stray inductance shown in FIG. 3 has been grouped into four groups, namely, stray bus inductance ($L_{bs1}$, $L_{bs2}$), stray termination inductance ($L_{ts1}$, $L_{ts2}$), stray leadframe inductance ($L_{fs1}$, $L_{fs2}$) and stray layout and wirebond inductance ($L_{ls1}$, $L_{ls2}$). Out of the four stray inductance groups, all are present within the module except for the stray bus inductance. The stray bus inductance is due to the bus interconnect between the module and the other circuit components.

Figure 4:
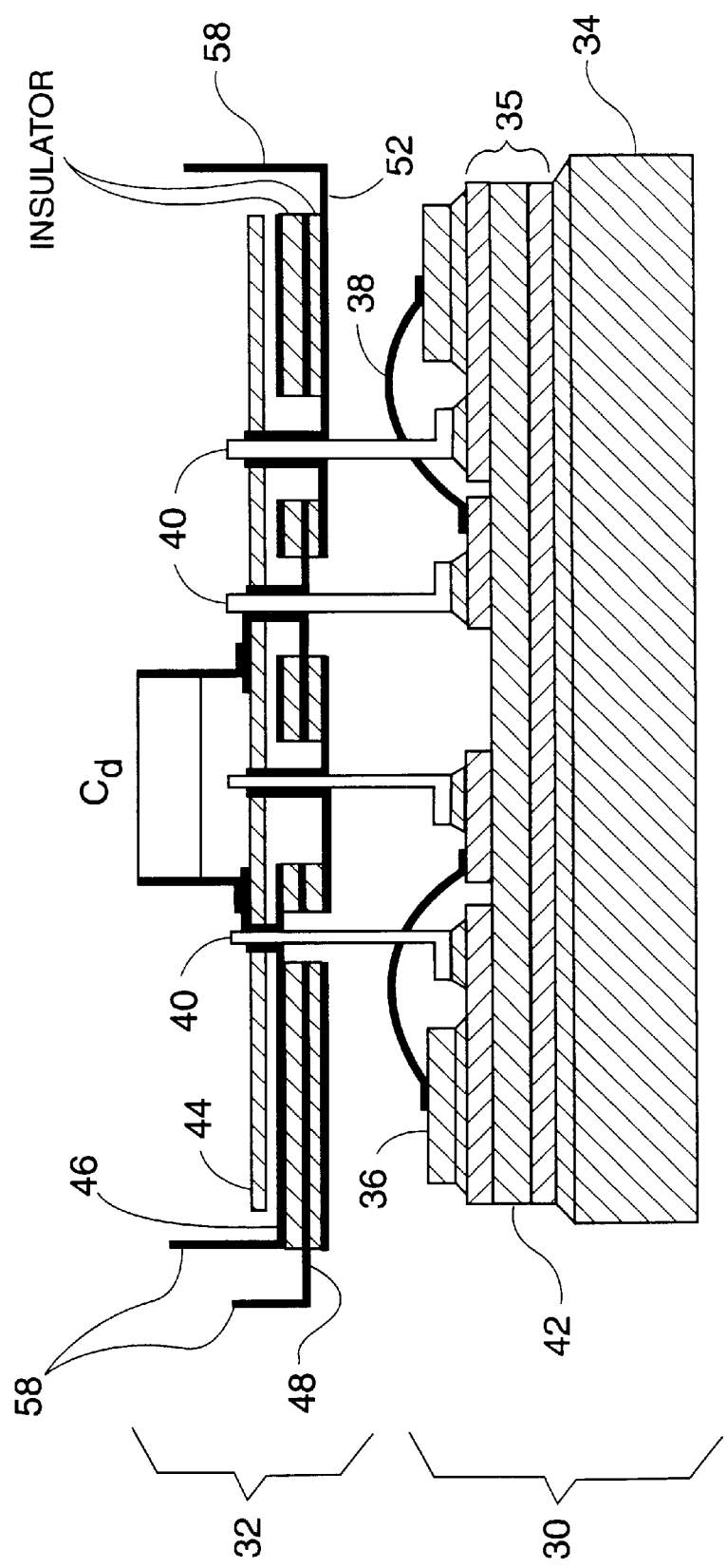
FIG. 4 is a cross sectional view of the power switching module of the present invention.

The present invention separates the power switching module into two components, a transistor stack 30 containing the power switching elements and an interconnect layer assembly 32 providing the interconnect for all power terminals and power circuit input and output terminations, as shown in FIG. 4.

The transistor stack 30 is preferably of the type disclosed in related patent application entitled "Power Block Assembly and Method of Making Same," which is hereby incorporated by reference in its entirety. The transistor stack 30 includes a base plate 34, such as copper, providing mechanical rigidity to the transistor stack 30. An insulating substrate 35 having an insulating layer 42, such as ceramic or polyimide, provides electrical isolation between the transistor stack 30 and the silicon die 36. Silicon die(s) 36 form the power switching elements of the power switching module and are interconnected via aluminum wire bonds 38. Leadframe terminal posts 40 correspond to the lead terminals of power switching elements 36 and extend away from the transistor stack 30. Although only one transistor stack 30 is shown in FIG. 4, it should be understood that the present invention applies to multiple related transistor stacks (not shown).

The interconnect layer assembly 32 includes a first thin copper layer 44 on a printed circuit board/laminate patterned to form the small signal level connections 45 from the power gates, sources and drains of the power switching elements, as shown in FIG. 5a. The signal layer 44 is preferably 100 μm thick.

In order to help decouple the stray bus inductance from the stray inductance in the module, a capacitor $C_b$ may be used at the module terminals. In some applications, however, the device 10 may be placed in harsh locations or in limited spatial areas. In these applications, it is not feasible to place the electrolytic capacitors close to the module. Also, the placement of the decoupling capacitor at the module terminal may not be possible since the assembly process would be difficult and also since special arrangements may have to be made to house the capacitor.

For these reason, the decoupling capacitor $C_d$ is placed in the module as shown in FIG. 4. The decoupling capacitor $C_d$ is preferably placed directly across the Drain/Collector leads of the upper switch to the Emitter/Source leads of the lower switch on the signal layer 44 of the assembly. One decoupling capacitor $C_d$ per phase leg is needed. This allows the addition of a resistive shunt in either the positive or negative leg of the bridge, or both, without the usual penalty of the insertion impedance (stray inductance) of this element.

This gives the flexibility to locate the terminals in any convenient position to meet the application and assembly requirements. Moving the decoupling capacitor $C_d$ inside the module not only decouples the stray bus inductance but also decouples the stray termination inductance. This helps in further reducing the voltage overshoots and switching losses. Inside the module the capacitor can be encapsulated or covered using silicone gel to prevent any moisture interactions and thus extend the capacitor life.

Figure 5B:
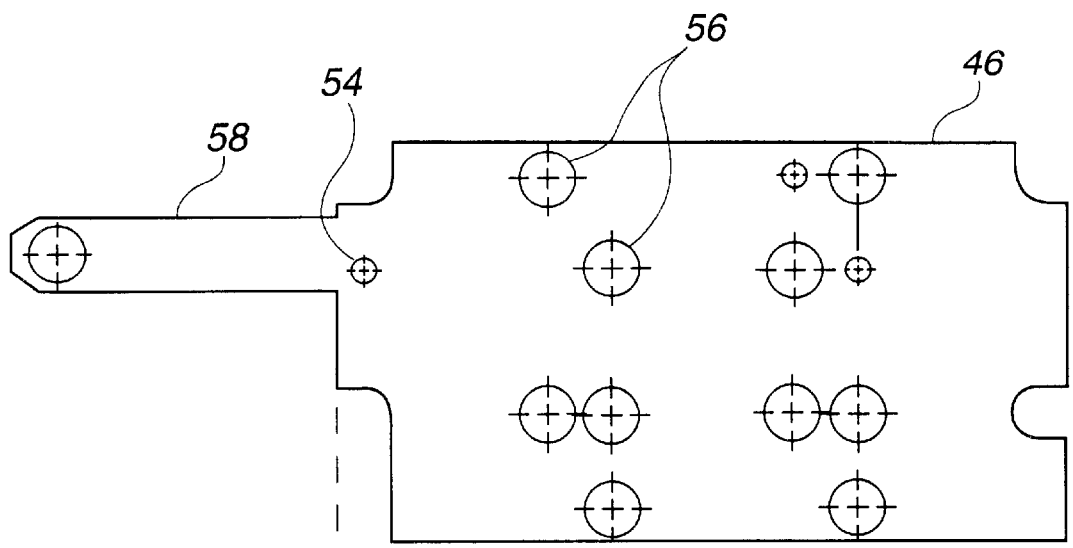
Figure 5C:
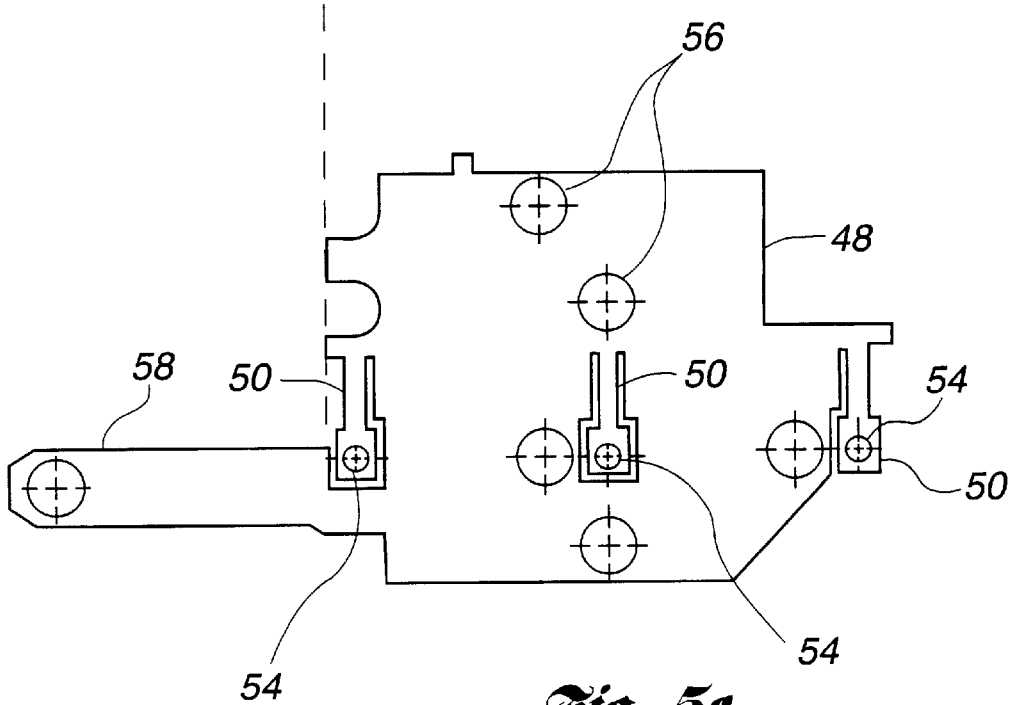

The interconnect layer assembly 32 further includes three additional copper layers, separated by insulating film. These three additional layers are preferably 32 mils thick. The thickness of the insulating film typically depends on the voltage rating of the module 10 and the thickness of the copper leads, and is preferably 6 mils KAPTON polyimide. The first two layers, which form coplanar conducting sheets, are designed to reduce the stray inductance of the module interconnect, $L_{fs1}$, $L_{fs2}$. The layers include a positive rail layer 46 providing positive power supply to the power module, and a negative rail layer 48 providing negative power supply, as shown in FIGS. 4 and 5b, 5c, respectively.

The negative rail layer 48 may include sense resistors 50 formed therein in the form of long, thin rectangular-shaped fingered tabs to detect overcurrent conditions. A conductive material in the form of a long, thin rectangular tab represents a resistance, R, according to (PL/A) (where, P=electrical resistivity, L=length of tab, and A=area of tab) with measurable voltage drop (IxR). The length (L) and cross-sectional area (A) of the fingered tabs are chosen to obtain a voltage drop (IxR) large enough to reliably detect a peak rated current for a MOSFET or an IGBT.

Figure 5D:
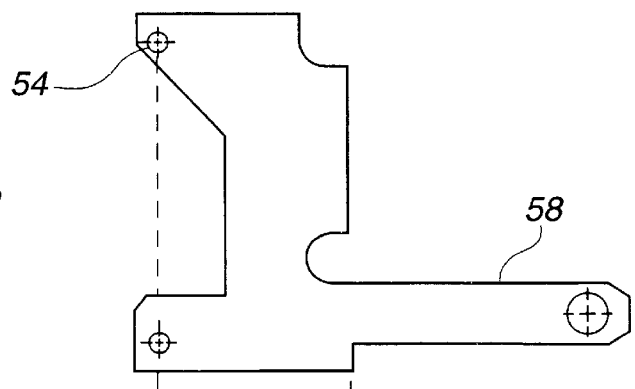
Figure 5E:
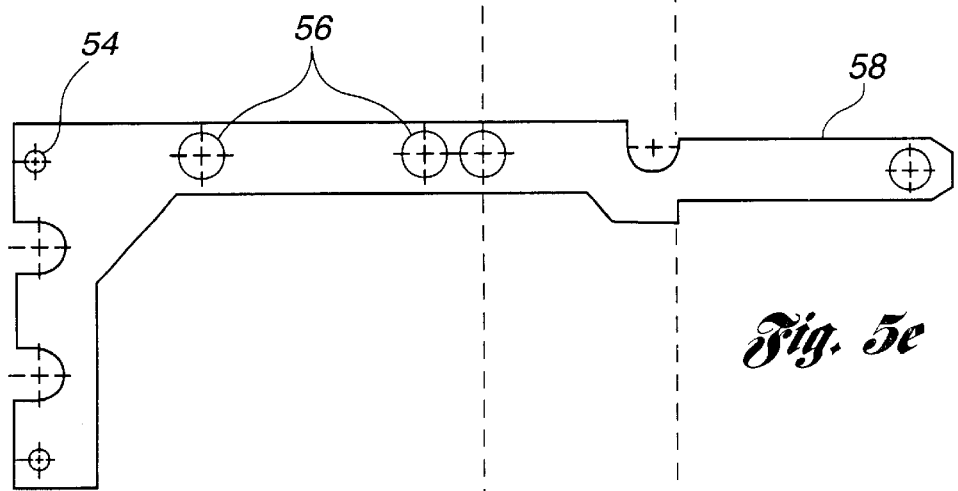
Figure 5F:
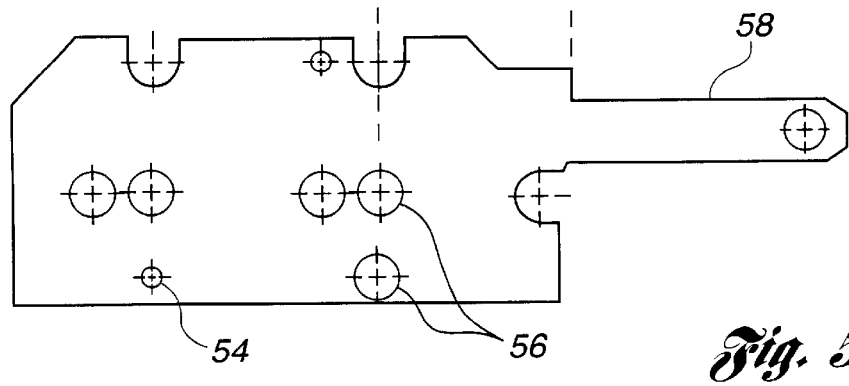

The final layer is a phase output layer 52 that holds the three phase outputs, as shown in FIG. 4. The phase output layer may be formed from three separate pieces of metal that when combined form one single layer or, alternatively, from three separate pieces of metal in which two combine to form one layer (FIGS. 5e and 5f) and the third metal layer (FIG. 5d) forms a second layer.

Figure 6:
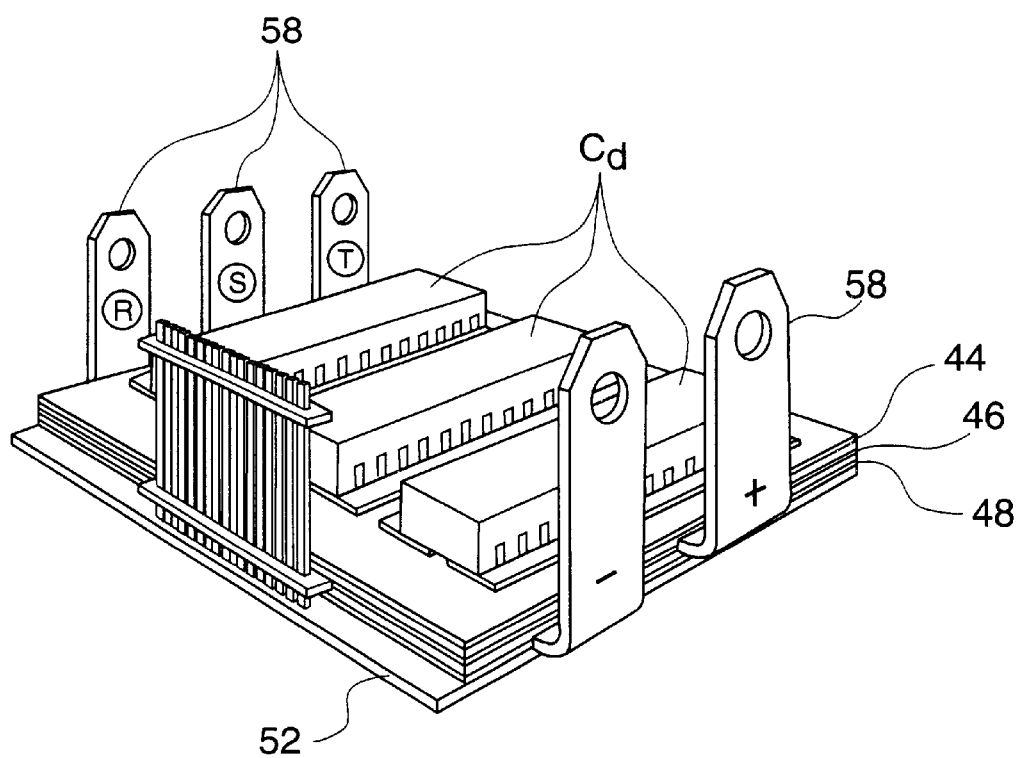
FIG. 6 is a perspective view of the interconnect layer assembly of the present invention in their bent position.

Each of the layers 44, 46, 48, 52 are connected to certain terminal posts 40 so as to provide electrical connection between the transistor stack 30 and each of the layers 44, 46, 48, 52. This is accomplished via connection holes 54 (of which only a portion are shown in FIGS. 5b, 5c, 5e and 5f) and clearance holes 56 (FIGS. 5a–5f). Connection holes 54 are located so as to allow interconnection of the layers with certain terminal posts 40 extending from the transistor stack 30. Clearance holes 56 are located so as to align with all of the leadframe terminal posts 40 extending from the transistor stack 30 so that each of the layers 44, 46, 48, 52 can be stacked or layered upon each other. A soldering or welding operation makes these connections during the module assembly process. A finished assembly is illustrated by FIG. 6.

As can be seen in FIGS. 4, 5a—5f and 6, each of the layers 44, 46, 48, 52 also include fingers 58 formed therein. After assembly of each of the layers 44, 46, 48, 52 onto the transistor stack 30, the fingers 58 are bent upwards away from the transistor stack 30 for connection with an actuator, motor, or load (not shown). The fingers 58 are screw connections that preferably fit into a slot of a plastic housing containing a nut. The fingers 58 could also be plug connectors or crimped connectors.

The power switching module of the present invention is flexible in that various types (half bridge, full bridge, three phase bridge, etc.) of power modules with different ratings can be built with minor changes to the thickness of the copper layers and the hole patterns. Moreover, this invention allows for pre-testing of the interconnect layer assembly which helps in achieving very high final test yields.

While the best modes for carrying out the invention have been described in detail, those familiar with the art to which this invention relates will recognize various alternative designs and embodiments for practicing the invention as defined by the following claims.

What is claimed is:

1. A high power switching module comprising:

a substrate having at least one silicon die forming at least one switching element and having corresponding leadframe terminal posts extending away therefrom; and an interconnect layer separated from the substrate, wherein the interconnect layer comprises:

a planar negative rail layer for providing a negative power supply to the power switching module;

a planar positive rail layer for providing a positive power supply to the power switching module, wherein the negative rail layer and the positive rail layer are arranged to be parallel with respect to each other so as to minimize stray inductance; and a phase output layer for providing a phase output signal from the power switching module, wherein each of the layers are electrically isolated from each of the other layers and connected to predetermined terminal posts to provide electrical connection between the substrate and each of the layers of the interconnect layer, wherein the negative rail layer includes at least one sense resistor formed therein to implement overcurrent protection of the power switching module.

2. The module as recited in claim 1 wherein each of the layers include clearance holes and connection holes, the clearance holes being located so as to align with all of the lead frame terminal posts extending away from the substrate so that each of the layers can be layered upon each other and the connection holes being located so as to allow interconnection of the layers with certain terminal posts extending away from the substrate.

3. The module as recited in claim 1 wherein the sense resistor is a thin, rectangular-shaped tab.

4. The module as recited in claim 1 further comprising an insulating film disposed between each of the layers.

5. The module as recited in claim 1 wherein each of the layers of the interconnect layer is a copper material.

6. The module as recited in claim 1 wherein each of the layers of the interconnect layer include a finger formed therein corresponding to an electrical terminal and wherein each of the fingers are bent away from the substrate for wiring into a component associated with the module.

7. The module as recited in claim 1 wherein the substrate includes a plurality of substrates, each of the plurality of substrates being electrically connected to each of the layers.

8. The module as recited in claim 1 wherein a signal layer includes at least one decoupling capacitor electrically coupled between the negative rail layer and the positive rail layer.

* * * * *